United States Patent [19]

Long

[11] Patent Number: 5,260,234

[45] Date of Patent: Nov. 9, 1993

[54] METHOD FOR BONDING A LEAD TO A DIE PAD USING AN ELECTROLESS PLATING SOLUTION

[75] Inventor: Jon M. Long, Livermore, Calif.

[73] Assignee: VLSI Technology, Inc., San Jose, Calif.

[21] Appl. No.: 773,519

[22] Filed: Oct. 9, 1991

Related U.S. Application Data

[62] Division of Ser. No. 631,802, Dec. 20, 1990.

[51] Int. Cl.$^5$ ................. H01L 21/58; H01L 21/60
[52] U.S. Cl. ................................ 437/203; 437/220; 437/230
[58] Field of Search ............... 437/203, 211, 217, 220, 437/230

[56] References Cited

U.S. PATENT DOCUMENTS

| | | | |
|---|---|---|---|
| 3,597,834 | 8/1971 | Lathrop et al. | 437/230 |
| 3,625,837 | 12/1971 | Nelson et al. | 437/230 |
| 3,870,068 | 3/1975 | Dutkewych et al. | 137/268 |
| 3,965,277 | 6/1976 | Guditz et al. | 430/319 |
| 4,122,215 | 10/1978 | Vratny | 437/230 |
| 4,143,618 | 3/1979 | Del Vecchio | 118/603 |
| 4,205,099 | 5/1980 | Jones et al. | 437/183 |
| 4,406,248 | 9/1983 | Araki et al. | 118/690 |
| 4,824,803 | 4/1989 | Us et al. | 437/192 |
| 4,933,049 | 6/1990 | Murphy et al. | 205/88 |
| 5,019,209 | 5/1991 | Hiraide et al. | 156/630 |

FOREIGN PATENT DOCUMENTS

| | | | |
|---|---|---|---|
| 52-75272 | 6/1977 | Japan . | |
| 54-53859 | 4/1979 | Japan . | |
| 54-114973 | 9/1979 | Japan . | |
| 60-250652 | 11/1985 | Japan . | |
| 2-66953 | 3/1990 | Japan | 437/230 |

OTHER PUBLICATIONS

Merrill L. Minges et al., "Electronic Materials Handbook—vol. 1, Packaging", *ASM International*, p. 11450, (Nov., 1989).

Donald P. Seraphim et al., "Principles of Electronic Packaging", *McGraw-Hill Book Company*, 476–484; 493–500; 581–582; 611–618 (1989).

*Primary Examiner*—Olik Chaudhuri
*Assistant Examiner*—David E. Graybill
*Attorney, Agent, or Firm*—Majestic, Parsons, Siebert & Hsue

[57] ABSTRACT

An interconnect structure comprising an interconnection formed between a bond pad and the end of a lead. The layer includes nickel, copper, cobalt, palladium, platinum, silver or gold and is electrically conductive. Also, an apparatus for forming an interconnection by a metal plating process and a device having a lead, a substrate, and a bath containing an aqueous metal plating solution which permits formation of the interconnect structure. A method of forming an interconnect structure including the step of placing a lead adjacent to a bond pad and placing the two in an electroless plating solution so that the interconnect structure may be formed.

6 Claims, 3 Drawing Sheets

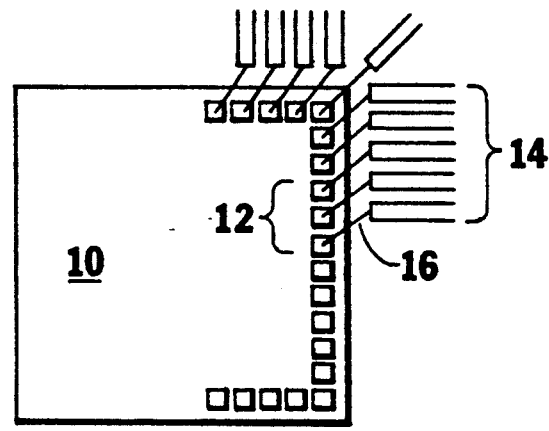
PRIOR ART
FIG.\_1.
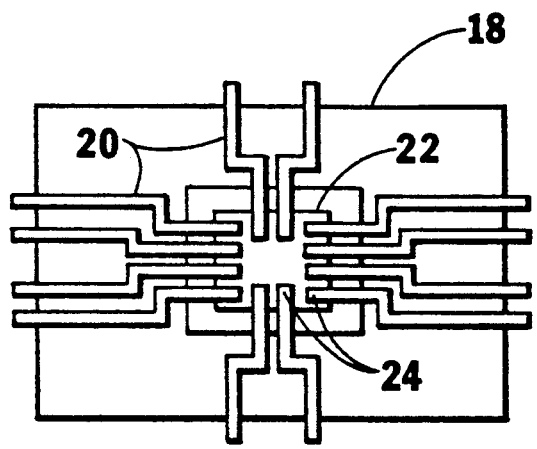
PRIOR ART
FIG.\_2.

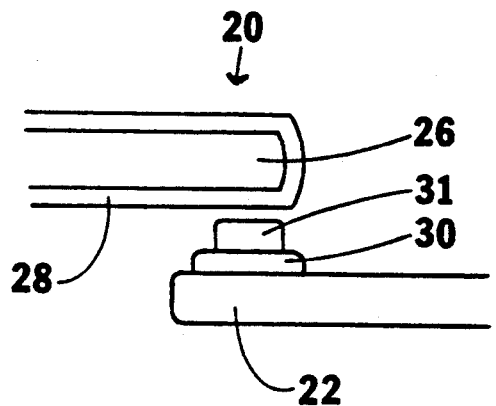
PRIOR ART
FIG._3.
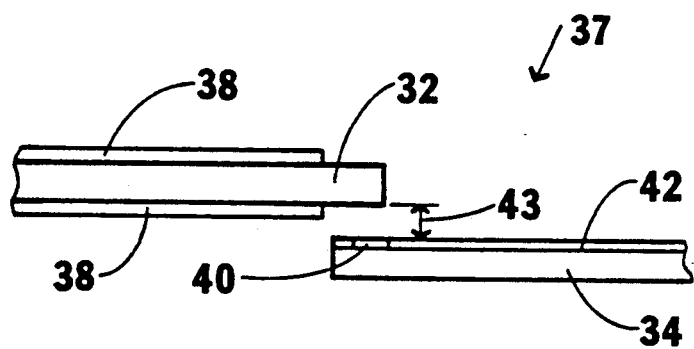
FIG._4.

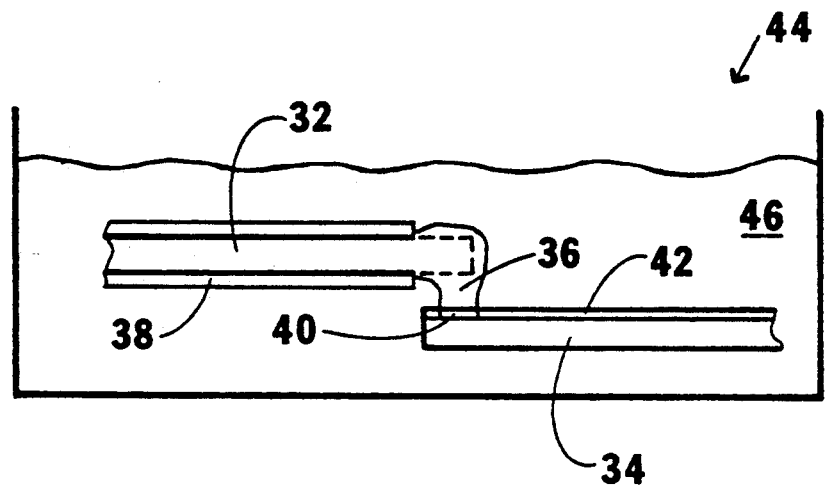
FIG._5.
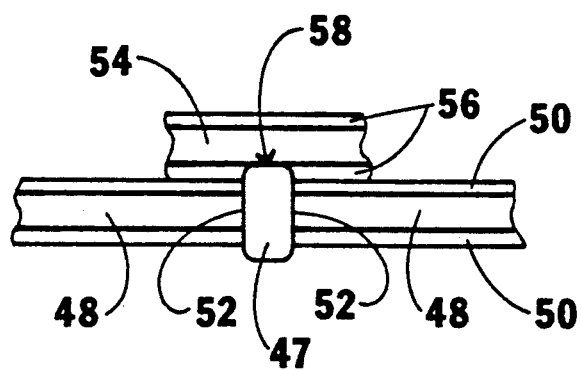
FIG._6.

METHOD FOR BONDING A LEAD TO A DIE PAD USING AN ELECTROLESS PLATING SOLUTION

This is a divisional of application Ser. No. 631,802, filed Dec. 20, 1990.

BACKGROUND OF THE INVENTION

This invention relates to a novel interconnect structure for an integrated circuit package. More specifically, this invention relates to an interconnect structure for electrically connecting two electronic components and a method of making the same.

In the semiconductor industry, an integrated circuit (IC) device must be connected to a lead frame or some other support structure to produce a complete IC package. Technology has recently produced more powerful devices which can be packaged more densely. However, as the size of the devices has decreased, problems associated with connecting the device to the lead frame or other support structure have arisen.

An integrated circuit is usually fabricated on a semiconductor wafer and has a number of bond pads on the surface of the wafer which connect to various components of the circuit. The bond pads are connected to a wire or some other electrically conductive device to permit utilization of the IC. Two common methods of connecting a device to a lead frame or some other support device are wire bonding and Tape Automated Bonding (TAB).

Wire bonding is a commonly used method of connecting a bond pad to, for instance, a lead frame. Shown in FIG. 1 is a semiconductor die 10 having a plurality of bond pads 12 on its surface. The die sits on a lead frame (not shown) which has a plurality of leads 14 positioned adjacent the die. A bonding machine welds a bonding wire 16 to a bond pad 12 and to a lead 14. This packaging method is acceptable for devices with bond pads which are spaced relatively far apart. However, this method becomes increasingly problematic as the size of the devices and the bond pads decrease because it is difficult to weld such small bond pads with acceptable accuracy. In addition, the materials used are expensive and the bond pad fabrication process is complex. The force applied to the bond pad during welding may damage small dies since the devices become increasingly fragile and sensitive to force and heat as their size decreases. Wire bonding may therefore be difficult to use with small and fragile dies or high density devices.

A new packaging technique known as tape automated bonding (TAB) emerged which does not have some of the limitations of wire bonding. A typical TAB package is shown in FIG. 2 and includes a layer of tape or film 18 having a plurality of conductive leads 20 formed upon it. The leads 20 are connected to a semiconductor die 22 at the ends 24 by means of soldering or by thermocompression welding.

FIG. 3 illustrates a typical cross section of a single TAB lead prior to being connected to a die. Lead 20 is positioned adjacent to a bonding portion of the die 22 prior to connection. To form the leads on the TAB tape (not shown), a copper layer 26 is deposited on the tape and then a second layer 28 of conductive material coats the copper to prevent its oxidation. This second conductive layer is usually composed of tin or gold. Selected portions of the two layers are etched away and the remaining portions form the lead 20. An aluminum bond pad 30 is positioned on the die 22 and is coated with gold to form a bump 31. The gold portions of both the lead and the bonding portion are welded together by a bonding machine.

TAB is more useful than wire bonding for dense packages since no bonding wires are necessary because each lead is bonded directly to a bond pad. The widths of the TAB leads may also be decreased from those used in a wire bonding process. This feature permits a TAB package to be smaller than an analogous wire bonded package.

A disadvantage to TAB packaging is the expense of the materials used. While tin may be used in place of gold, there is a tradeoff between the cost and ease of manufacture, and therefore neither material is ideally suited for TAB. Additionally, there are problems associated with the bonding force and heat, and the yield on TAB packages is therefore not as high as desired if the process is not closely monitored. The force from compression can cause cracks or craters underneath the bond pads, making the device unusable. TAB packaging is an expensive and complex process and illustrates the need for a cost-effective and mass-producible process by which an integrated circuit may be packaged.

The difficulties suggested in the preceding are not intended to be exhaustive, but rather are among many which may tend to illustrate the ineffectiveness of prior art packaging techniques. Other noteworthy problems may also exist; however, those presented above should be sufficient to demonstrate that packaging techniques appearing in the past will admit to worthwhile improvement.

OBJECTS AND SUMMARY OF THE INVENTION

It is therefore a general object of the invention to provide a novel interconnection in an integrated circuit package which will obviate or minimize difficulties of the type previously described.

It is a specific object of the invention to provide an interconnect structure which substantially reduces or eliminates the force applied to a semiconductor device during a packaging process.

It is another object of the invention to provide an interconnect structure which can be fabricated at a moderate temperature.

It is still another object of the invention to provide an interconnect structure which is inexpensive and easy to produce.

One aspect of the invention which accomplishes at least some of the foregoing objects is directed to an interconnect structure comprising a bond pad on the surface of a semiconductor wafer, a lead, and an interconnection. The interconnection comprises a layer formed between and surrounding a portion of the bond pad and the lead. The layer is formed of nickel, copper, cobalt, palladium, platinum, silver or gold, and is electrically conductive and bonds the lead to the bond pad.

A second aspect of the invention covers an apparatus for forming an interconnection by means of a metal plating process. The apparatus comprises a device which has at least one lead, a substrate, and a bath containing an aqueous metal plating solution which permits formation of an interconnect structure between the lead and the substrate. The lead and the substrate are submerged into the bath to form an electrically conductive interconnect structure which bonds the lead to the substrate.

A third aspect of the invention is directed to another apparatus for forming an interconnection by means of a metal plating process. The apparatus comprises a semiconductor device having a surface and a bonding portion on the surface, a substrate for supporting the device and having an opening through the substrate for forming a via, and an electroless bath. The bath has an aqueous metal plating solution in which an interconnect structure is formed when the bonding portion of the device, held adjacent to the via, is immersed in the solution.

Another aspect of the invention includes a method of forming an interconnect structure between an aluminum bond pad, positioned on a semiconductor wafer, and a copper lead. The method includes the steps of securing the lead adjacent to the bond pad, providing an aqueous metal plating solution, and surrounding the lead and the bond pad by the plating solution to permit formation of an interconnect structure between the lead and the bond pad. Additional steps include leaving the bond pad and the lead in the plating solution for a predetermined time period until an interconnect structure having a desired thickness is formed, and then removing the bond pad and the lead from the solution.

DESCRIPTION OF THE DRAWINGS

Other advantages of the present invention will become apparent from the following detailed description of a preferred embodiment thereof, taken in conjunction with the accompanying drawings, wherein:

FIG. 1 is a plan view of a prior art semiconductor device package using wire bonding techniques;

FIG. 2 is a plan view of a prior art semiconductor device package using tape automated bonding (TAB) techniques;

FIG. 3 is a cross-section of a single TAB lead positioned adjacent to a bond pad prior to welding;

FIG. 4 is a side view of a lead and a substrate prior to formation of the interconnect structure of the present invention;

FIG. 5 is a side view depicting the lead and the substrate of FIG. 4 in an electroless bath which permits formation of the interconnect structure of the present invention; and FIG. 6 is a side view of an alternate embodiment of the interconnect structure of the present invention, shown forming a via between a substrate and a semiconductor wafer.

DETAILED DESCRIPTION OF THE INVENTION

Referring now to the drawings, wherein like numerals indicate like parts, and initially to FIG. 4, there will be seen a side view of an apparatus 37 having a lead 32 positioned adjacent a die 34 prior to formation of the interconnect structure of the present invention. The lead 32 is composed of copper and has a protective layer 38 which exposes only the portion of the lead which will become part of the interconnect structure. The semiconductor die 34 has a bond pad 40 composed of aluminum on its surface and is the portion of the die which will become part of the interconnect structure. The semiconductor die has an existing protective layer 42 which will permit only the bond pad which is exposed to come into contact with an aqueous metal solution to form the interconnect structure as described below.

The distance 43 between the bond pad 40 and the lead 32 may vary according to the manner by which the two are held adjacent to each other. Optimally, the distance 43 will be minimal. Distances up to 15 microns are permissible to form an interconnect structure. The lead may actually touch the bond pad at some point while permitting an interconnecting bond to form between the lead and the bond pad. The lead may be held adjacent to the bond pad by a lead frame or by some other means. For instance, the interconnect structure may be formed with the leads being attached to a tape and secured adjacent to bond pads, such as in a TAB package, without departing from the scope of the instant invention. Additionally, the bond pads do not have to be on the edges of the die, but may be positioned anywhere on the die surface. The interconnect structure may be formed at any location as long as the bond pad and lead are secured adjacent to one another. The interconnection may therefore be formed over active circuitry in the center of the die.

Shown in FIG. 5 is the apparatus 37 immersed in an electroless bath 44 having an aqueous metal solution 46. The solution may be composed of nickel, copper, cobalt, palladium, platinum, silver or gold so that an interconnect structure 36 will be formed. The interconnect structure is formed when copper atoms in the lead give up electrons and the aqueous metal solution receives the electrons and plates onto the copper. The solution similarly plates onto the aluminum bond pad, and forms the interconnect structure 36 which is electrically conductive and bonds the lead 32 to the bond pad 40 of the die.

The aqueous metal solution 37 may include any solution which has an electron affinity sufficient to accept electrons from aluminum and copper, and plate onto both the lead and the bond pad. The use of nickel is preferred, because it is a hard metal and forms a strong joint around the lead. Nickel also produces a good-quality protective oxide barrier and therefore does not need to be coated with a protective layer (unlike gold, for instance). In addition, nickel is very inexpensive compared to other metals that could be used. If a thinner oxide were desired, however, another metal could be used. An example of an aqueous nickel solution includes a hypophosphite bath which produces an interconnect structure composed of approximately 10% phosphorus. Phosphorus is similar to a catalyst to the reaction.

An interconnect structure 47 can also be formed between two surfaces, as shown in FIG. 6. A substrate 48 is covered with a protective layer 50 on all surfaces except the sides 52 of an opening. The substrate supports a semiconductor wafer 54, which is covered by a protective layer 56 on all sides except a bonding portion 58. The substrate and the wafer are held adjacent to each other and are submerged into an electroless bath, as described above. The interconnect structure 47 for forming a via is formed from the bonding portion 58 through the opening of the substrate and plating to the substrate walls 52. The bonding portion 58 of the wafer may be composed of copper, and the bath may be composed of any aqueous metal solution suitable for forming the interconnect structure, such as those described above.

The present invention also includes a method of forming the interconnect structures described above. Formation of an interconnect structure between a semiconductor die having at least one aluminum bond pad and the end of a copper lead will be described herein. However, this method is not limited to connection of a bond pad to a lead, but may also be used to connect any discrete components.

Prior to formation of the interconnect structure, a copper lead is coated with a protective layer on all surfaces except the end where the interconnect structure is to be formed. The surface of the die containing circuit structures is coated during device fabrication by a passivation layer. No protective layer needs to coat the remaining die surfaces, since silicon is not an electron donor (acceptor), and therefore will not react with an aqueous metal solution to be used. The first step in the method of forming an IC interconnection is to secure the relative positions of the end of the lead and the bond pad by a lead frame or a tape, or some other means. The lead and the bond pad are positioned adjacent to one another, and preferably no more than 15 microns apart. An aqueous metal plating solution is provided and includes either nickel, copper, cobalt, palladium, platinum, silver or gold. The lead and the bond pad are then submerged into the bath, and are removed from the bath when a desired interconnect structure is formed. The protective layers on the surfaces of the bond pad and lead are then removed.

The lead and bond pad remain in the bath long enough for an interconnect structure of a desired thickness to form. The time that they must remain in the bath depends upon the distance between the lead and the bond pad. The further apart they are, the longer they must remain in the bath to form a sufficiently thick interconnect structure. A reaction time of ten to twenty minutes may be suitable. The reaction is performed at room temperature, but the bath may be heated somewhat to decrease the reaction time.

The bath contains an aqueous metal solution which will accept electrons from the copper lead and plate to the lead. As described above, there are a number of possible solutions which will function properly, but nickel is the preferred metal because it is inexpensive and will also form a strong joint. The bath in a preferred embodiment is electroless, but an electrolytic bath may also be used. An electrolytic bath permits formation of a thicker interconnect structure than an electroless bath. This is because the copper electrons are continuously replaced by the electric current and therefore the plating solution, which has an electron affinity, may continuously plate to the copper. In order to use an electrolytic bath, all areas to be plated must be shorted together. It is especially difficult to short all layers of a multilayer die, for instance. So while the supply of electrons in an electroless bath is finite, it is simpler to use an electroless rather than an electrolytic bath because the components to be plated do not need to be shorted together.

The method of the present invention may also be used with a semiconductor die having a plurality of bond pads. The entire die may be bonded to the substrate simultaneously if the die and the substrate are held adjacent to each other and are immersed in the appropriate aqueous metal solution.

After reading and understanding the foregoing inventive interconnect structure and method of making the same, in conjunction with the drawings, it will be appreciated that several distinct advantages of the subject invention are obtained. Without attempting to set forth all of the desirable features of the instant invention, at least some of the major advantages of the invention include formation of an interconnect structure between a semiconductor die or wafer and a lead without the use of force or heat. The probability of cratering is therefore significantly reduced. Use of an electroless aqueous metal bath permits formation of the interconnect structure by simply placing the components to be bonded together in an aqueous metal solution.

A group of devices could be bonded simultaneously by using a large bath, thereby reducing the cost of manufacture. Additionally, the use of aluminum bond pads reduces the cost of manufacture relative to the prior art because gold was previously used. The plating process is simple and inexpensive.

It should be noted that although the invention has been described with reference to specific embodiments, it should not be construed to be so limited. Those skilled in the art and familiar with the instant disclosure of the subject invention may recognize additions, deletions, modifications, substitutions and other changes which will fall within the purview of the subject invention and claims.

What is claimed is:

1. A method of forming an interconnect structure between a semiconductor wafer having at least one bond pad composed of aluminum and the end of at least one lead composed of copper, said method comprising the steps of:

securing the relative positions of said end of said lead and said at least one bond pad by a securing means so that the end and the pad are adjacent to each other;

providing an aqueous metal plating solution;

surrounding said at least one lead and said at least one bond pad by said plating solution to permit formation of an interconnect structure between said lead and said bond pad;

leaving said bond pad and said lead in said plating solution for a predetermined time period until an interconnect structure having a desired thickness is formed; and removing said bond pad and said lead from said aqueous metal plating solution when an interconnect structure between said end of said lead and said bond pad having a desired thickness is formed.

2. The method as defined in claim 1 wherein the step of surrounding said bond pad and said lead by said plating solution comprises the step of submerging said semiconductor wafer and said lead into an electroless aqueous nickel solution.

3. The method as defined in claim 1 wherein the step of leaving said bond pad and said lead in said plating solution includes the step of leaving them in said plating solution for approximately fifteen minutes.

4. The method as defined in claim 1 wherein the step of providing an aqueous metal plating solution is performed at substantially room temperature.

5. The method as defined in claim 1 and further including the following step to be performed prior to said securing step:

coating the surface of said lead with a protective layer except at said end of said lead where the interconnect structure is to be formed.

6. The method as defined in claim 5 and further including the following step to be performed after the step of removing said bond pad and said lead from said aqueous metal plating solution:

removing said protective layer from the surface of said lead and said bond pad.

* * * * *